(12) United States Patent
Lin

(10) Patent No.: US 6,257,904 B1
(45) Date of Patent: Jul. 10, 2001

(54) CONNECTOR WITH BGA ARRANGEMENT FOR CONNECTING TO PC BOARD

(75) Inventor: Yu-Hsu Lin, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/525,991

(22) Filed: Mar. 15, 2000

Related U.S. Application Data

(63) Continuation of application No. 09/136,980, filed on Aug. 20, 1998.

(51) Int. Cl.[7] ............................................... H05K 1/00
(52) U.S. Cl. .................................. 439/83; 439/67; 439/71
(58) Field of Search ................................ 439/71, 91, 591, 439/74, 75, 66, 83, 67

(56) References Cited

U.S. PATENT DOCUMENTS

| | | | |
|---|---|---|---|
| 4,349,862 | * 9/1982 | Bajorek et al. | 361/401 |
| 5,691,041 | * 11/1997 | Frankeny et al. | 428/209 |
| 5,997,317 | * 12/1999 | Pei et al. | 439/83 |

* cited by examiner

Primary Examiner—Brian Sircus
Assistant Examiner—Chaudrika Prasad
(74) Attorney, Agent, or Firm—Wei Te Chung

(57) ABSTRACT

A connector assembly (10) includes a housing (12) defining a plurality of passageways (14) to receive a corresponding number of contacts (16) therein. Each contact (16) includes a pin type contact leg section (18) extending out of the undersurface (20) of the housing (12) with a substantial distance. An interposer plate (22) which is of the same or similar property as the PC board (100) on which the connector assembly (10) is mounted, is disposed on the undersurface (20) of the housing (12). A plurality of through holes (24) are provided within the interposer plate (22) in alignment with the corresponding passageways (14) so that the distal end portion (19) of the leg section (18) of each contact (16) can extend into and through the corresponding hole (24). A solder ball (26) is attachably implanted to the undersurface (28) of the interposer plate (22) beside each hole (24), and a trace (30) is provided between each solder ball (26) and the corresponding hole (24) for electrical interconnection therebetween.

12 Claims, 5 Drawing Sheets

CONNECTOR WITH BGA ARRANGEMENT FOR CONNECTING TO PC BOARD

This is a continuation-in-part of the copending application Ser. No. 09/136,980 filed Aug. 20, 1998.

BACKGROUND OF THE INVENTION

1. Field of the Invention

The invention relates to a connector assembly with BGA type contacts, and particularly to a connector assembly with an interposer plate for implantation of solder balls thereon.

2. The Related Art

A CPU is a necessary component of a personal computer. For economic reasons the CPU is electrically connected to the mother board by a socket connector. Conventional socket connectors are disclosed in U.S. Pat. Nos. 5,399,108, 5,489,218 and 5,679,020. The conventional socket may be a unitary housing providing a LIF (Low Insertion Force) application or a two piece housing providing a ZIF (Zero Insertion Force) application. Recently SMT (surface mounting technology) has become popular thus such conventional sockets having pin type contacts for wave-soldering attachment to the board can no longer facilitate manufacture.

Ball type contact portions, i.e. BGA (Ball Grid Array), for SMT mounting to a PC board is becoming an increasingly common technique for attaching IC chips. One approach involves attaching ball-like contact leg sections, i.e. solder balls, on a bottom surface of the socket instead of the conventional pin type contact tails. However, the material of the PC board and that of the socket are different. Implantation of the solder balls onto the bottom surface of the socket causes difficulties in manufacture. Additionally, the socket is made by ejection molding and has an inherently loose tolerance in comparison with the PC board which is precisely made with a tight tolerance. The inherent inferior tolerance of the socket may result in positional and coplanarity problems of the implanted balls. Moreover, due to different material properties between the PC board and the socket, CTE (coefficient of Thermal Expansion) mismatch between the socket and the PC board on which the socket is mounted through the solder balls may overstress the solder balls causing rupture of thereof during manufacture.

Therefore, an object of the invention is to provide an improved connector assembly with a BGA (Ball grid Array) contact arrangement which overcomes the problems discussed above.

SUMMARY OF THE INVENTION

According to an aspect of the invention, a connector assembly includes a housing defining a plurality of passageways for receiving a corresponding number of contacts therein. Each contact includes a pin type contact leg section extending a substantial distance beyond an undersurface of the housing. An interposer plate having the same or similar properties as a PC board on which the connector is mounted, is disposed on the undersurface of the housing. A plurality of through holes is provided within the interposer plate in alignment with the corresponding passageways so that a distal end portion of the leg section of each contact can extend into and through the corresponding hole. A solder ball is attachably implanted to a bottom surface of the interposer plate beside each hole, and a trace is provided between each solder ball and the corresponding hole for establishing electrical interconnection therebetween. The leg section of each contact can be retained in the corresponding hole of the interposer plate through a wave soldering procedure, and is electrically connected to the corresponding solder ball through the trace disposed therebetween. The connector together with the associated interposer plate can be mounted to the PC board by applying a reflow process to the solder balls whereby the solder balls partially melt and successively solidify to be attachably soldered to the PC board.

DETAILED DESCRIPTION OF THE PREFERRED EMBODIMENT

Reference will now be in detail to the preferred embodiment of the present invention.

Figure 1:
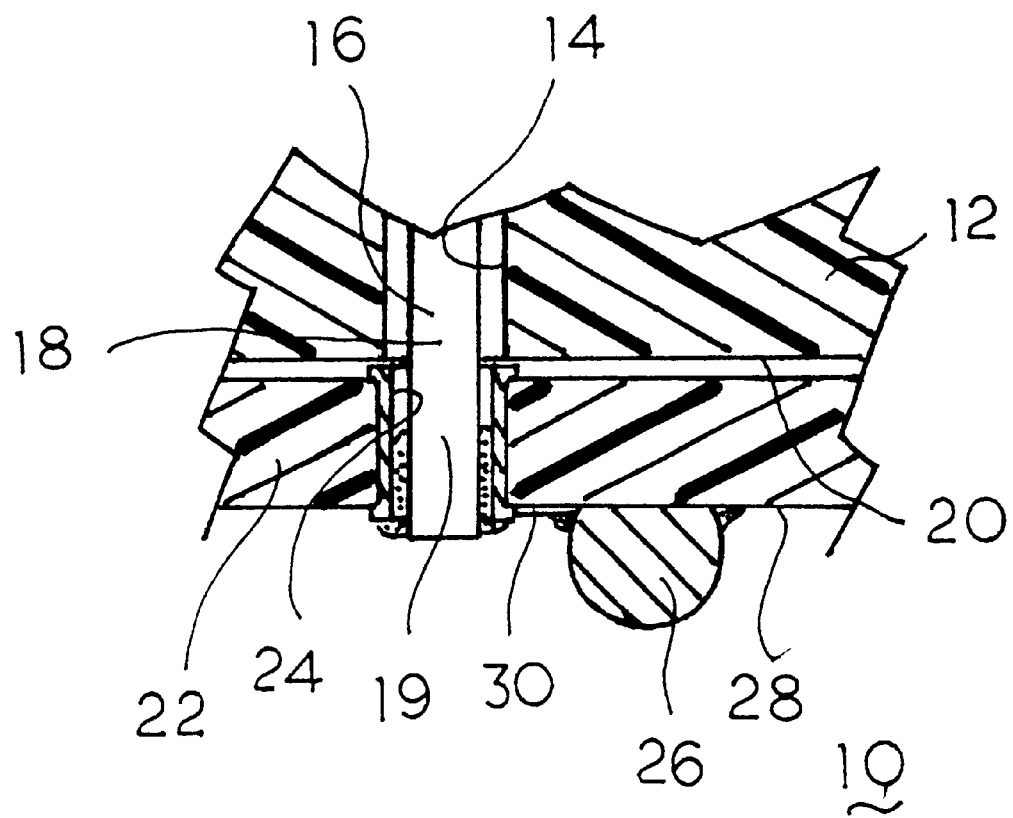
FIG. 1 is a partial, cross-sectional view of of an connector assembly in accordance with the present invention.
Figure 2:
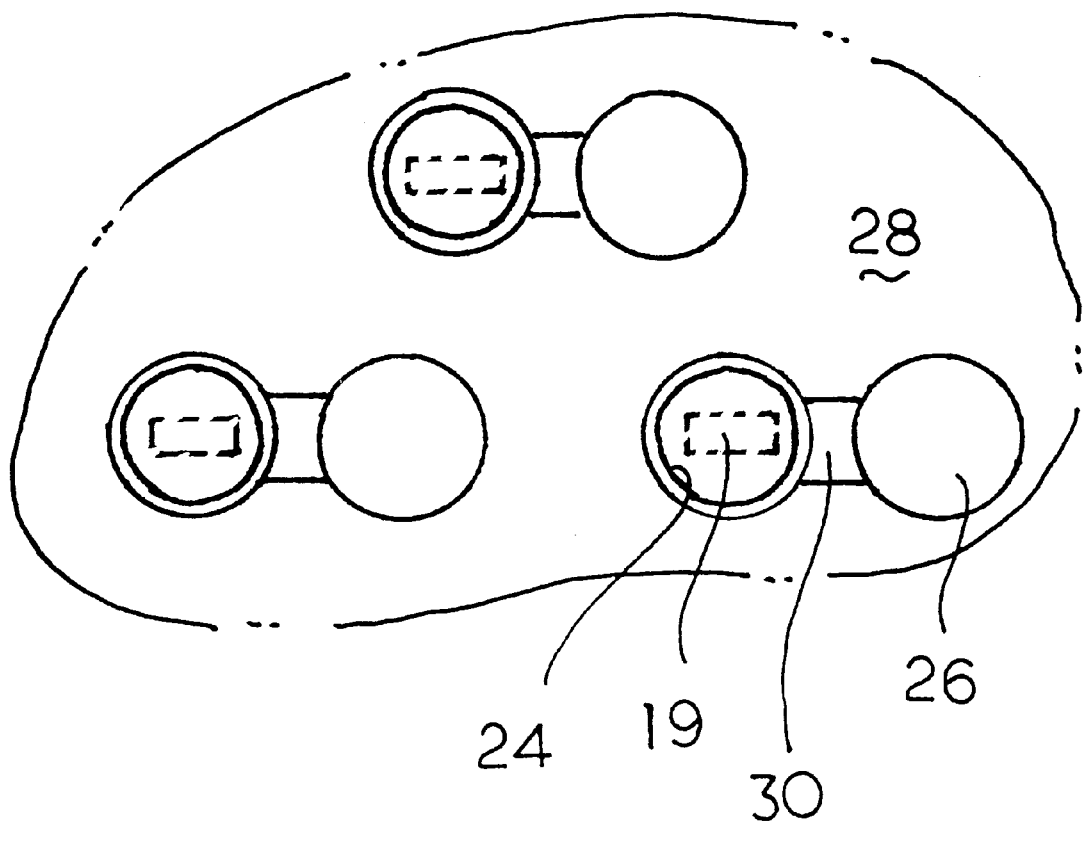
FIG. 2 is a partial plan view of an underside of an interposer plate of the connector assembly.

Attention is directed to FIGS. 1 and 2. A connector assembly 10 includes an insulative housing 12 defining a plurality of passageways 14 (only one shown) for receiving a corresponding number of contacts 16 wherein an upper section (not shown) of the contact 16 is adapted to engage with a conductive pin of a PGA chip (not shown), and a leg section 18 of the contact 16 extends beyond an undersurface 20 of the housing 12.

An interposer plate 22 is provided below the housing 12. The interposer plate 22 includes a number of holes 24 in alignment with the corresponding passageways 14 of the housing 12 whereby end sections 19 of the leg section 18 of the contact 16 extend through the holes 24. A solder ball 26 is implanted on an undersurface 28 of the interposer plate 22 beside each hole 24, and a trace 30 is provided between each hole 24 and the corresponding solder ball 26 for establishing electrical interconnection therebetween.

There are two ways to assemble the housing 12 and the interposer plate 22. The first method is to implant the solder balls 26 onto the undersurface 28 of the interposer plate 22., The attached solder balls 26 are then covered. The end sections 19 of the leg sections 18 of the contacts 16 then extend through the corresponding holes 24 and are soldered therein by a wave soldering process. The second method is to simultaneously attach the solder balls 26 and the end sections 19 of the leg sections 18 of the contacts 16 to the interposer plate 22. Solder paste is applied to the undersurface 28 between the solder balls 26 and the holes 24 whereby the solder balls 26 and the end sections 19 of the leg sections 18 of the contacts 16 are connected by means of the solder paste., The solder balls 26 and the end sections 19 of the leg sections 18 of the contacts 16 can then be secured to the interposer plate 22 by a reflow process.

Figure 3:
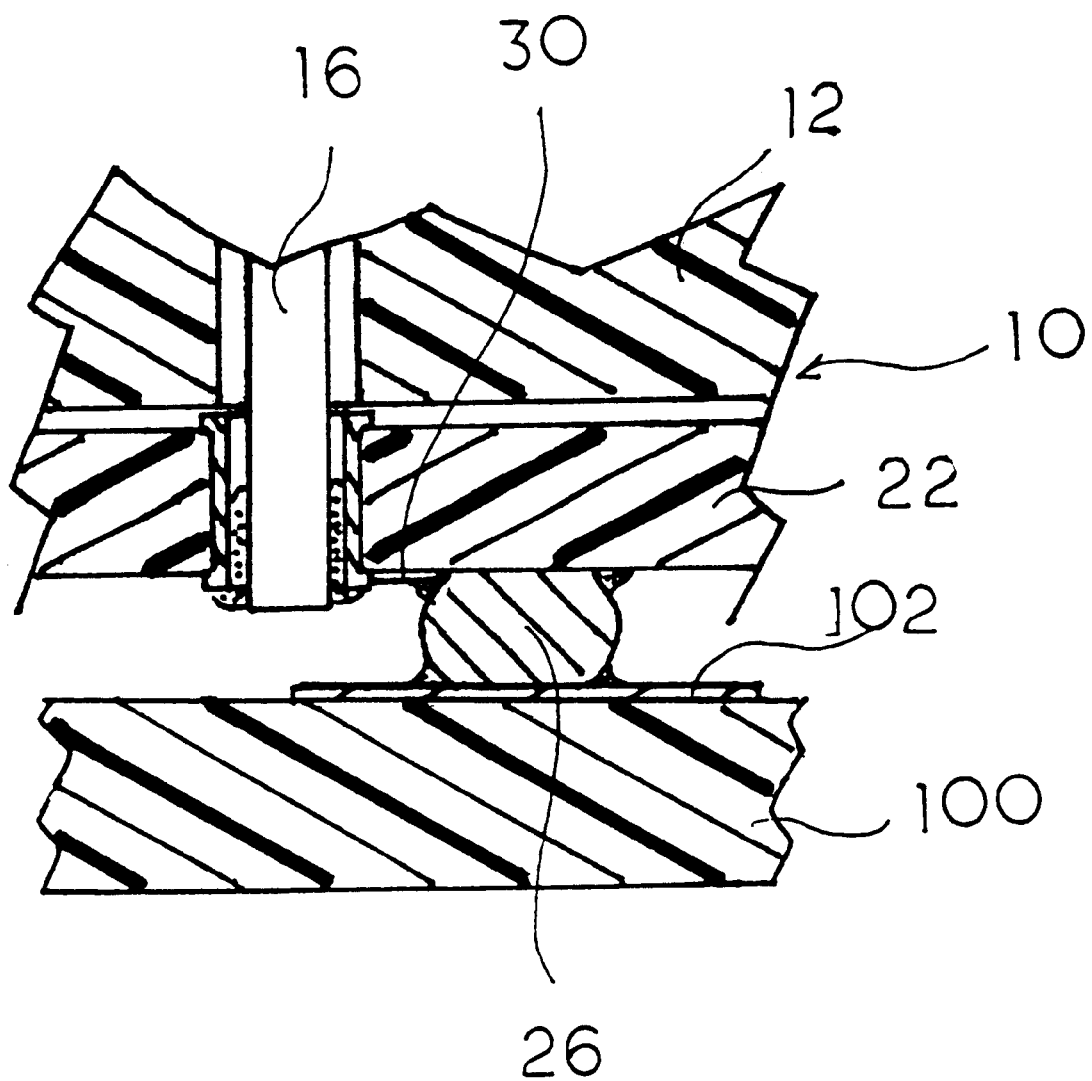
FIG. 3 is a partial cross-sectional view of the connector assembly of the present invention mounted on a mother board.

Referring to FIG. 3, after the connector assembly 10 is assembled, the connector assembly 10 can be directly mounted to a mother board 100 through another reflow process whereby each solder ball 26 is connected with a corresponding solder pad 102. As a result, a transmission path is established from the pins of the PGA chip through the contacts 16, the traces 30, and the solder balls 26, to the solder pads 102 on the mother board 100 and corresponding circuits thereof.

Since the interposer plate and the PC board are made of the same material, rupture of the solder balls due to different CTEs during the reflow procedure is unlikely. Also, the technique of attaching the solder ball to the PC board facilitates assembly. Moreover, since the interposer plate is constructed of the same material as the PC board high precision/tight tolerance thereof is ensured which is very important for controlling the position and coplanarity of the corresponding attached solder balls.

The pin type leg sections of the contacts can be attachably soldered to the corresponding holes of the interposer plate by a traditional wave soldering process, which facilitates assembly and reduces costs. The features and advantages of the invention are related to two matters. First, the invention uses reliable and proven technology, i.e., the traditional wave soldering procedure applied to the pin type contact tail and the interposer plate and the traditional implantation of solder balls onto the PC board, to replace the unstable, uncontrollable conventional practice of directly implanting the solder balls onto the socket. Secondly, since the interposer plate and the PC board are constructed of the same material, the solder balls will no longer be ruptured due to the CTE difference proximate the respective connection areas. In comparison with the conventional BGA type socket which has solder balls directly mounted onto the undersurface of the housing, the present invention prevents thermal stress fatigue due to cyclical temperature changes during an on/off operation and relatively enhances solder joint reliability.

From another viewpoint, the invention provides an improvement over the conventional pin type PGA (Pin Grid Array) socket whereby the PGA socket can be mounted to the PC board through the interposer plate by an SMT procedure instead of the conventional wave soldering process.

Another advantage of the invention is that the interposer plate is sufficient to maintain planarity thereby ensuring a good connection between the solder balls and the corresponding solder pads on the PC board. It should be noted that coplanarity is a very important consideration for SMT. The conventional socket tends to warp resulting in deformation of the undersurface of the housing. Under this situation, the solder balls implanted on the undersurface of the housing will not be coplanar resulting in defective connection with the corresponding solder pads of the mother board. The defective solder joint may result in either inferior signal transmission or fatigue due to overstress.

It is also appreciated that the solder balls 26 and the corresponding contacts 16 are offset from each other to avoid mutual influence during manufacture or operation.

Figure 4:
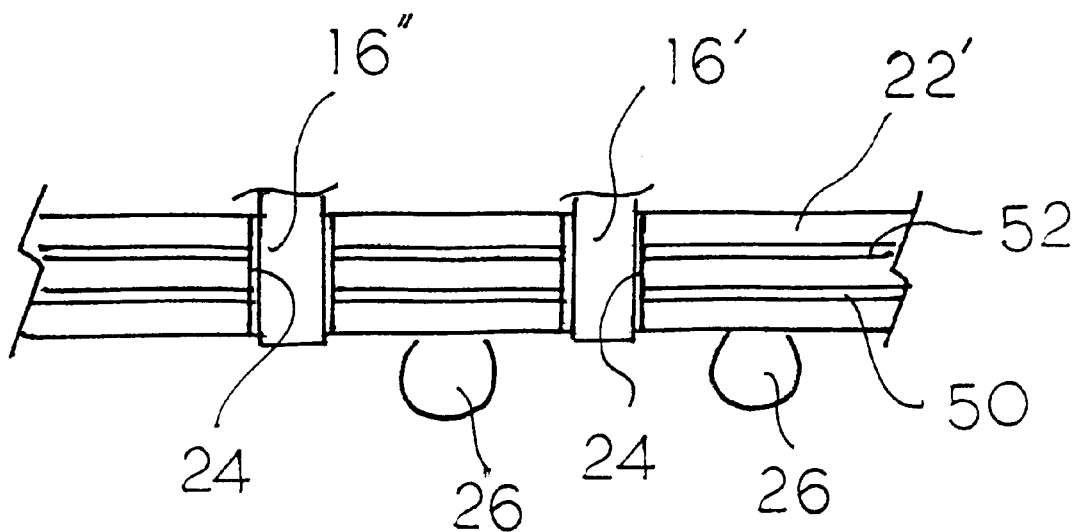
FIG. 4 is a partial cross-sectional view of another embodiment of the connector assembly.

Another advantage of using the interposer plate 22 is to allow fan-in/fan-out function of the solder ball layout which provides flexibility to meet the circuits layout on the mother board. Understandably, the solder balls which are directly attached to the bottom ends of the contacts without using the interposer plate in the prior art, may be restrained as the specific matrix arrangement by following the pitch relation of the contacts. In opposite, the invention provides adjustment function. FIG. 4 shows another embodiment of the interposer plate 22' which includes the built-in ground plane 50 and power plane 52 to improve the electrical performance, wherein other than the signal contact 16, the ground contact 16' electrically connects to the ground plane 50, and the power contact 16" electrically connects to the power plane 52.

Figure 5:
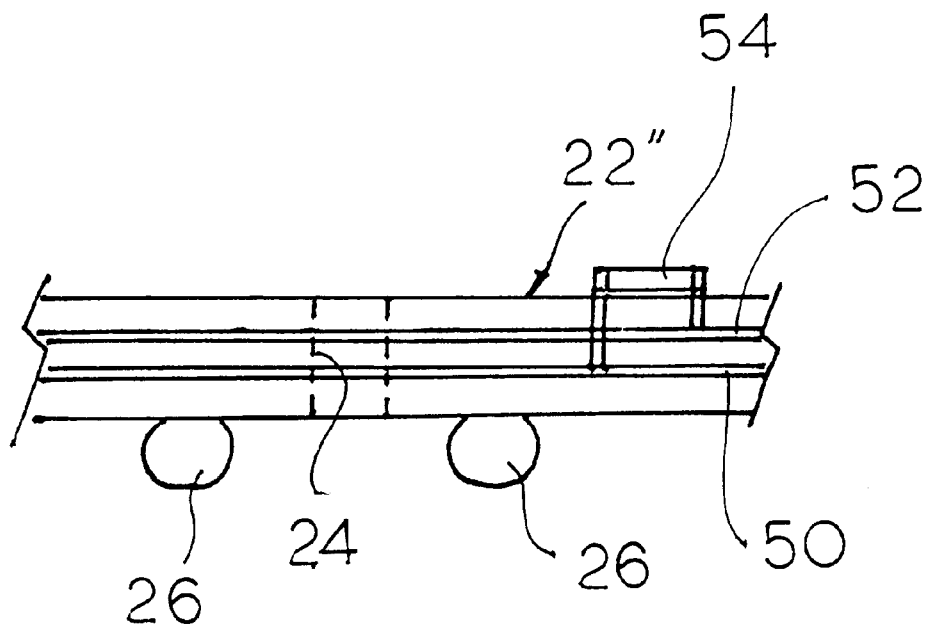
FIG. 5 is a partial cross-sectional view of another embodiment of the connector assembly.
Figure 6:
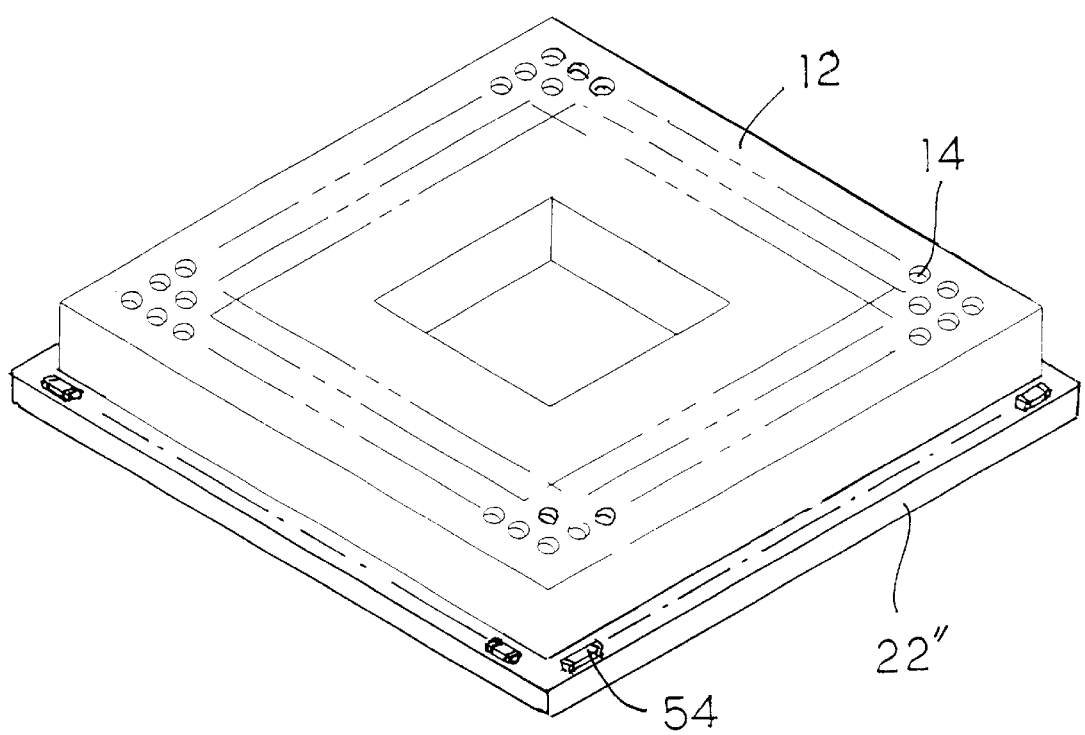
FIG. 6 is a perspective view of the connector assembly of FIG. 5 where the capacitors are disposed along the edge portion of the interposer plate.

FIG. 5 shows another embodiment of the interposer plate 22" which not only includes the built-in ground plane 50 and power plane 52, but also includes a capacitor 54 having two electrodes at two opposite ends respectively electrically connected to the ground plane 50 and power plane 52, thus efficiently regulating performance of the connector assembly 10. Understandably, the capacitor 54 can be replace by the active components, i.e., ICs, or the passive components, i.e., inductors, for improving some specific electrical performance. FIG. 6 shows the capacitors 54 of FIG. 5 are disposed along the edge portion of the interposer plate 22". Under that situation, the interposer plate 22" is slightly larger than the housing 12. It can be noted that such capacitors 54 can be also disposed on the rest of the top surface of the interposer plate 22" other than the edge portion as long as there is sufficient space between the interposer plate 22" and the housing 12.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims. Therefore, persons of ordinary skill in this field are to understand that all such equivalent structures are to be included within the scope of the following claims.

I claim:

1. A connector assembly for surface mounting to a PC board, comprising:

an insulative housing defining a plurality of passageways, said housing owning a different coefficient of thermal expansion with regard to the PC board;

a number of pin type contacts being received within said passageways, respectively;

an interposer plate made of a material similar to as the PC board and disposed below the housing and connecting with said pin type contacts; and a plurality of solder balls attached to an undersurface of the interposer plate, wherein each of said solder balls is electrically connected to the corresponding one of said contacts.

2. The connector assembly as defined in claim 1, wherein the interposer plate further includes a plurality of holes beside the solder balls, respectively, and an end section of each of said contacts is received within the corresponding one of said holes.

3. The connector assembly as defined in claim 2, wherein a trace is provided between one of said solder balls and the corresponding one of said holes so that a transmission path is established between the contact and the corresponding solder ball.

4. An arrangement of transforming a wave soldering connection to a surface mounting connection for a connector regard to a PC board, comprising:

the connector including an insulative housing and having a plurality of pin type contacts each defining a leg section and an associated end section thereabouts, said end section extending out of an undersurface of the housing, said housing owning a different coefficient of thermal expansion with regard to the PC board; and an interposer plate disposed below the housing and connecting with said pin type contacts, said interposer plate including a plurality of solder balls on an undersurface of the interposer plate, each of said solder balls corresponding to one of said contacts; wherein the contacts are electrically connected to the corresponding solder balls, respectively.

5. The arrangement as defined in claim 4, wherein a plurality of holes are provided within the interposer plate for receiving therein the corresponding end sections of the contacts, respectively.

6. The arrangement as defined in claim 4, wherein the solder ball is offset from the corresponding contact in a vertical direction.

7. The arrangement as defined in claim 4, wherein thermal properties of the interposer plate are closer to those of the PC board.

8. A system for electrically interconnecting a CPU to a mother board, comprising:

a connector including a housing with a plurality of pin type contacts extending downward out of an undersurface of the housing;

an interposer plate disposed below said connector, and connected to said pin type contacts while without being directly mechanically connected to the housing;

a plurality of solder balls attached to an undersurface of said interposer plate; and the mother board including a plurality of solder pads thereon; wherein a lower portion of each solder ball is aligned and engaged with the corresponding solder pad on the mother board, and an upper portion of the solder ball is electrically connected to the corresponding contact of the connector.

9. The system as defined in claim 8, wherein the solder ball and the corresponding contact are electrically connected by a trace horizontally extending on the undersurface of the interposer plate.

10. A connector assembly for surface mounting to a PC board, comprising:

an insulative housing defining a plurality of passageways, said housing owning a different coefficient of thermal expansion with regard to the PC board;

pin type signal, ground and power contacts being received within said passageways, respectively;

an interposer plate disposed below the housing and connecting with said pin type contacts; and a plurality of solder balls attached to an undersurface of the interposer plate, wherein each of said solder balls is electrically connected to the corresponding one of said contacts; wherein said interposer plate defines ground and power planes therein, and the power contacts electrically connect to the power plane while the ground contacts electrically connect to the ground plane.

11. The connector assembly as defined in claim 10, wherein a capacitor is mounted on the interposer plate, and said capacitor includes two electrodes respectively electrically connecting to the power plane and the ground plane.

12. The connector assembly as defined in claim 11, wherein said capacitor is located on an edge portion of said interposer plate.

* * * * *